United States Patent [19]

Johnsen et al.

[11] Patent Number: 5,815,373
[45] Date of Patent: Sep. 29, 1998

[54] COUPLING DEVICE PRESENTING AND/OR DOMINATING A CAPACITANCE BELONGING TO A BOARD WITH A PRINTED CIRCUIT

[75] Inventors: Helge Bodahl Johnsen, Huddinge; Mats Olav Timgren, Saltsjö-Boo, both of Sweden

[73] Assignee: Telefonaktiebolaget LM Ericsson, Stockholm, Sweden

[21] Appl. No.: 776,765

[22] PCT Filed: Jul. 31, 1995

[86] PCT No.: PCT/SE95/00892

§ 371 Date: Feb. 7, 1997

§ 102(e) Date: Feb. 7, 1997

[87] PCT Pub. No.: WO96/06389

PCT Pub. Date: Feb. 29, 1996

[30] Foreign Application Priority Data

Aug. 22, 1994 [SE] Sweden ................. 9402792/7

[51] Int. Cl.⁶ ................. H05K 1/03; H05K 1/11; H05K 1/14; H05K 1/16

[52] U.S. Cl. ................. 361/763; 174/255; 361/306.2; 361/765; 361/794

[58] Field of Search ................. 29/830; 174/255, 174/260, 261; 257/700, 723, 724; 333/181, 184, 185, 247; 361/306.2, 306.3, 313, 328, 329, 763, 765, 766, 782, 794, 321, 322; 428/901, 209, 426; 501/9, 61, 17, 62, 67, 69, 18

[56] References Cited

U.S. PATENT DOCUMENTS

| | | | |
|---|---|---|---|
| 4,441,070 | 4/1984 | Davies et al. | |
| 4,779,185 | 10/1988 | Musil. | |
| 5,010,641 | 4/1991 | Sisler | 428/901 |
| 5,065,284 | 11/1991 | Hernandez | 361/794 |
| 5,079,069 | 1/1992 | Howard et al. | 361/794 |
| 5,161,086 | 11/1992 | Howard et al. | 361/763 |
| 5,162,977 | 11/1992 | Paurus et al. | 361/763 |
| 5,198,969 | 3/1993 | Redl. | |
| 5,365,407 | 11/1994 | Nakabayashi et al. | 361/794 |

FOREIGN PATENT DOCUMENTS 3-258101 11/1991 Japan .................. 361/763

*Primary Examiner*—Donald Sparks
*Attorney, Agent, or Firm*—Burns, Doane, Swecker & Mathis, LLP

[57] ABSTRACT

The invention relates to a coupling device presenting a capacitance belonging to a board with a printed circuit, where said board (1) consists of several electrically conducting layers (50e, 50g) with electrically isolating layers in between (50eg). A surface extension of a reference potential related layer (50e), an opposite surface extension of a supply voltage related layer (50g) and a chosen distance in between said layers are adapted to form a capacitor function to smooth voltage spikes so that the DC-supply voltage can be constant around circuits (2) mounted on said board even at rapid current variations as said circuits and/or components are activated.

4 Claims, 2 Drawing Sheets

COUPLING DEVICE PRESENTING AND/OR DOMINATING A CAPACITANCE BELONGING TO A BOARD WITH A PRINTED CIRCUIT

TECHNICAL FIELD

The present invention relates to a capacitance values presenting and/or dominating coupling device where said coupling device is integrated in or belongs to a board with a printed circuit.

Such printed circuit boards, where the present invention is intended to be used, consists of several electrically conducting layers, with electrically isolating layers in between.

It is in principle possible, within practical limits, to select any number of electrically conductive layers and any number of isolating layers within a printed circuit board but the number of layers is normally limited by a required predetermined thickness of the printed circuit board.

A necessary condition for the present invention is further that at least one of said electrically conducting layers is related to a reference potential, such as ground potential, while an adjacent electrically conducting layer is related to a supply voltage.

DESCRIPTION OF THE BACKGROUND ART

Printed circuit boards of the above described manner are previously known through a number of various embodiments.

One or several discrete circuits are applied to one or both sides of printed circuit boards of this kind. These circuits can be IC-circuits, ASIC-circuits and the like, and/or components such as resistances, capacitances and the like and usually are the most of these circuits or components supplied with a voltage through connecting conductors, connected to said reference potential related layer and said supply voltage related layer, either directly through the top surface of the printed circuit board or via board related conductors, usually extended across the top surface of the printed circuit board as bare conductors.

Circuits and/or components, such as integrated circuits, are previously known in a number of various embodiments but, even though the presence of such components is a necessity for the present invention, they will not be further described here, since the specific construction of each component is not a part of the present invention.

It can nevertheless be mentioned that integrated circuits can be equipped with edge related connecting pads, to which required connecting conductors are soldered, or they can be equipped with underlying connecting pins, a so called Pin Grid Array-connection (PGA).

It can further be mentioned that printed circuit boards of this kind can be made out of a number of sheets, each sheet consisting of two thin metal-foils applied to a relatively thick interjacent electrically isolating layer with a thickness of respective isolating layer usually selected to 0.2 to 0.3 mm.

Taking the significant characteristics of the present invention under consideration it can be mentioned that it is previously known to use capacitances with a large capacitance value, so called smoothing condensers, in order to thereby be able to smooth any voltage variations originating from a rectifying bridge to thereby form a smooth and more constant direct voltage.

It can further be mentioned, taking the present invention under consideration, that it is previously known to use a so called DC/DC-converter in order to form a precisely related voltage level, essentially regardless of the current which is required.

As an example of a DC/DC-converter of this kind references are made to the patent publication U.S. Pat. No. 5,198,969.

It is also previously known that, with an application on a printed circuit board, circuits and components are in the use of further capacitive means close to respective circuit, a so called "voltage spike smoothing condenser", which in the following will be referred to as a "spike condenser".

Such spike condensers are normally discrete components which are positioned close to the circuit in question.

The connecting conductors of these are normally relatively long and thereto often bare conductors on the surface of the printed circuit board.

Every such discrete capacitive component presents, in relation to the circuit, besides a capacitive value, an inner inductive value together with inductive values originating from the external connecting conductors (not taking the resistive values of the impedance into consideration), which together forms a resonance frequency: $f(r)=k/(LC)^{1/2}$.

An increasing number of various, but adjacent, resonance frequencies appears as the number of circuits with thereto belonging discrete capacitive components increases, which results in resonances that generates voltage variations exceeding the acceptable limits.

Said discrete spike condensers are thus intended to be able to smooth the voltage spike in the supply voltage which otherwise would appear whenever one or several loads in a circuit is activated or deactivated.

It is also expected that activations that are very short in time would generate larger voltage spikes then activations that endures over a longer period of time and that high load-currents would cause more powerful instantaneous voltage spikes then low load-currents.

It is further known that many discrete circuits, such as opto-electrical and electro-optical converters, are very sensitive to variations in the supply voltage and will cease to function in conditions where small variations from a nominal voltage value exists.

SUMMARY OF THE INVENTION

Technical Problems

With regards to the background art, as described above, it ought to be regarded as a technical problem to be able to provide a spike condenser, with a condenser function for smoothing, in order to thereby keep the voltage level, between the reference potential related layer and the supply voltage related level, constant around an activated circuit without having to use discrete capacitive elements.

It is then a technical problem to be able to show a way to use a plate condenser, formed out of two layers within a printed circuit board, with a capacitance value that is adapted to be relatively high through selected actions, in order to thereby more effectively be able to keep the levels of the supply voltage and the reference potential constant, even when a great amount of transistor functions, or the like, are connected and disconnected simultaneously within the circuits.

There is a technical problem in being able to realize that in this way one single required integrated spike condenser is provided, which is available and active for every circuit, regardless of the position of each circuit on the printed circuit board.

It is, besides this, a technical problem to be able to realize the measures that are required to be able to reduce the required surface area of a circuit, meaning the surface area which is required by a spike condenser adjacent and/or around a circuit, which holds the additional energy required to smooth a voltage.

It is also a technical problem to be able to realize the advantages that are obtained as such a required surface area can be reduced with the corresponding voltage smoothing due to reduced inductance values within the circuit arrangement of the spike condenser.

It is, besides this, a technical problem to be able to provide a spike condenser which can present a voltage smoothing function through very short connecting conductors, and thereby very low inductance values, in order to thereby increase the value of the resonance frequency.

It is also a technical problem to be able to realize the possibilities of that said short connecting conductors can be used for double purposes, both as DC-voltage supplying conductors to the circuit and as conductors to the spike condenser.

There is a technical problem in being able to realize the importance of forming a plate condenser by using two conductive layers within the printed circuit board, which can be adapted to present a relatively large capacitive value, even within every surface area, in order to thereby try to keep the supply voltage level and the reference potential level constant, even as the connecting time and/or the disconnecting time of the transistor functions are selected to be very short and the voltage spikes can be expected to appear with very short rise- and/or fall times.

It must also be regarded as a technical problem to be able to realize the conditions that are required in order to be able to use the fact that a selected surface extension of said reference potential related layer and a selected surface extension of said supply voltage related layer can be maximized if they are to serve as opposite plates within a spike condenser used in the present invention.

It must, besides this, be regarded as a technical problem to be able to realize the necessity of being able to perform an adapted reduction of the distance between the two electrically conductive layers in order to thereby adapt the enlargement of the capacitive value of the condenser.

It must also be regarded as a technical problem to be able to realize the importance and advantages of combining the selected surface extensions of said electrically conductive layers with a selected distance between said layers in order to thereby better be able to keep the DC-supply voltage, adjacent the circuits in question, constant.

It must be regarded as a further technical problem to be able to realize the importance of an adapted positioning of the used circuits on the printed circuit board so that the surface area, surrounding a circuit on the used, plate condenser formed, spike condenser, does not injuriously overlap or influence the surface area of the spike condenser belonging to the adjacent circuit.

Specifically at activation rates in the range of 100 Mb/s and more, and with short rise- and fall times, it ought to be regarded to be a technical problem to be able to realize the actions required to be able to control problems regarding Electro Magnetical Compatibility (EMC), which is even more severe as connecting conductors are bare.

There is also a technical problem in being able to show how to make use of a spike condenser through very short connecting conductors, such as 1.0 to 0.2 mm, which, besides being enclosed within the printed circuit board, presents very short lengths and thereby a small inductance value, even at high frequencies.

It is then a technical problem in being able to realize the importance of that the peripheral edge partition of the selected surface extension, belonging to said electrically conductive layers, are limited by the peripheral edge partitions of the printed circuit board.

It is also a technical problem in being able to realize the importance of that the distance between said layers is as small as possible, preferably adapted to 0.15 mm or less, but that this distance still is long enough to somewhat exceed a specified required value, such as the Electro Static Discharge (ESD) value.

Solution

In order to solve one or more of the above stated technical problems the present invention originates from a capacitance values presenting and/or dominating coupling device, belonging to a board with a printed circuit, where said board consists of several electrically conducting layers, with electrically isolating layers in between, where at least one of said electrically conducting layers is related to a reference potential, such as ground potential, and an adjacent electrically conducting layer is related to a supply DC-voltage, and where one or several circuits and/or components are supplied with a DC-voltage through connecting conductors, which are connected to said reference potential related layer and said supply DC-voltage related layer.

The invention shows that a surface extension of said reference potential related layer, an opposite surface extension of said supply DC-voltage related layer and a chosen distance in between said layers are each adapted and selected to form a circuit board internal spike capacitor so that the supplied DC-voltage can be constant around said circuits, even at rapid variations of the activation and/or rapid power consumption of said circuits and/or components, essentially irrespectively of the orientation of the circuit on the printed circuit board.

As a proposed embodiment, falling within the scope of the inventive thought, it is shown that the peripheral edge partitions of a selected surface extension, belonging to said electrically conductive layers, are limited by the peripheral edge partitions of the printed circuit board.

It is further shown that a DC/DC-converting circuit, with adapted smoothing capacitors, is applied as a discrete component to the printed circuit board or consists of a separate voltage supplying circuit, with the dc-voltage connected to said electrically conductive layer through short connecting conductors.

It is further shown that said distance, between the electrically conductive layers, is adapted to 0.15 mm or less.

It is, at rapid variations in the activation of transistor connections etc. within the used circuits, meant that the rise time and/or fall time of the currents through the connected circuits are to be within the range of nano-seconds to pico-seconds, only permitting the supply voltage level and/or ground potential level to vary within predetermined limit values, which limits corresponds to the limits of the circuits and/or components mounted to the printed circuit board and directly or indirectly influenced by the activation.

It is specifically shown that said connecting conductors, connecting a circuit with the supply voltage related layer and the reference voltage related layer respectively, are given a length which is selected to be as short as possible.

It is further shown that the value of the capacitance is adapt able by selecting a certain thickness of the isolating layer and a certain dielectric constant of the isolating material.

It is specifically shown that the thickness is selected to exceed a value, which is selected taking the given conditions under consideration, as little as it is practically possible.

It is further shown that a number of reference potential related layers and a number of supply voltage related layers are electrically connected to one another in order to thereby form a number of voltage spikes smoothing condensers connected in parallel.

The distance between the layers can be selected to be 0.06 mm or somewhat less, but normally longer than 0.01 mm.

The shortest possible length of the connecting conductors ought to be selected to be shorter than 1.5 mm, preferably 0.1 to 0.3 mm, such as 0.1 to 0.2 mm.

Advantages

The advantages that primarily can be regarded as characterizing for a coupling device, according to the present invention, by using two adjacent electrically conductive layers, presenting the largest surface extension possible, and an interjacent thin electrically isolating layer, belonging to a printed circuit board, as a spike condenser function, is that hereby a high capacitive value with a good stabilisation of the level of the supply DC-voltage is provided, even at short rise and fall times at the activation of one or several circuits, regardless of the position of these circuits on the printed circuit board, and besides this, very short distances are provided for the DC-supplying connecting conductors.

The primary characteristic features of a capacitance values presenting and/or dominating coupling device where said coupling device is integrated in or belongs to a board with a printed circuit, according to the present invention, are set forth in the characterizing clause of the following Claim 1.

BRIEF DESCRIPTION OF THE DRAWINGS

A presently proposed embodiment of a capacitance values presenting and/or dominating coupling device where said coupling device is integrated in or belongs to a board with a printed circuit, according to the present invention, and the background art, will now be described in more detail with reference to the accompanying drawings, in which.

DESCRIPTION OF EMBODIMENTS AT PRESENT PREFERRED

Figure 1:
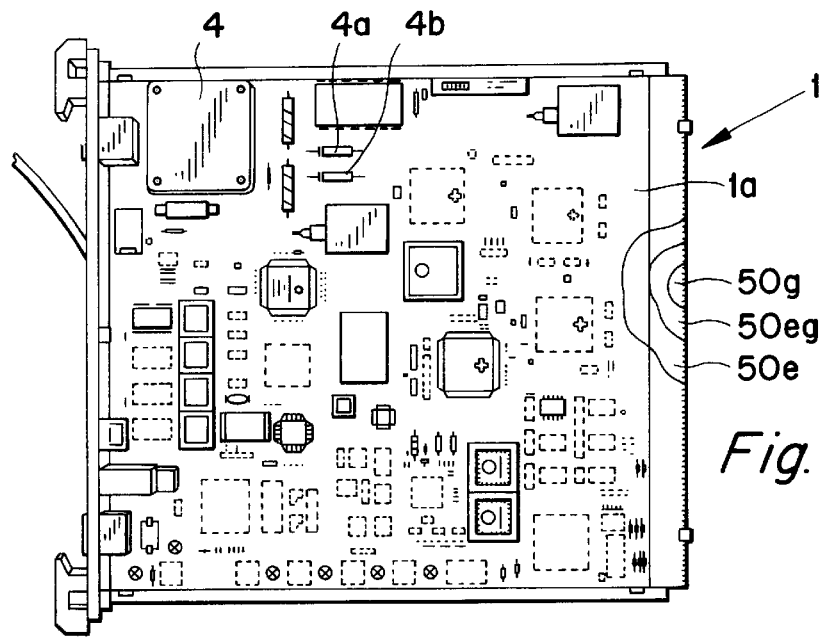
FIG. 1 shows, in plane view, a printed circuit board with one or several circuits and/or components applied thereto and with a capacitance values presenting coupling device, in the form of a spike condenser, according to the invention.

With reference to FIG. 1 a plane view of a printed circuit board 1 is shown, with one or several circuits and/or components firmly mounted to its top surface 1a, which circuits are supplied with a voltage through two connecting conductors belonging to respective circuit, these conductors being connected to electrically conductive layers within the printed circuit board, such as a reference potential related (ground potential related) layer (50e) and a supply DC-voltage related layer (50g).

One single integrated circuit, among several available, have, in FIG. 1, been given a numeral in order to clarify the principles of the invention.

Said IC-circuit 2 requires, for its function, said DC supply voltage. For its function it also requires externally attached components, such as resistances 3.

The IC-circuit 2 and the components 3 are called "discrete" circuits or "discrete" components since they constitute units that are attached to the printed circuit board.

The numeral 4 illustrates a DC/DC-converter, of a previously known kind, intended to supply a voltage to layers within the printed circuit board.

Required smoothing capacitors can be included within the DC/DC-converter and FIG. 1 is intended to illustrate that these are positioned at the top surface 1a of the printed circuit board 1 and given the numeral 4a and 4b.

The connecting conductors that are required here often become relatively long and therefore presents not only a resistive value but also, and more significant for the present invention, an inductive value, which increases with the length of the conductors and foremost with the frequency of the appearing spike voltages.

Transistor circuits etc. within the IC-circuit 2 will, on printed circuit boards of this kind, be activated and deactivated and thereby create instantaneous current variations, decreasing and increasing currents, and spikes in the supply voltage and reference ground potential, which will appear locally and belong to certain surface areas on the printed circuit board.

It is known that these spikes can be smoothed through the use of a spike condenser, such as a discrete component (see the condenser unit or arrangement 23 in FIG. 2), adjacent the circuit 2.

The IC-circuit 2 is, in a previously known way, connected to the top surface 1a of the printed circuit board 1 and through connecting pads 2a and 2b and the circuit 2 is supplied with a DC-voltage through conductors (not shown) that are connected between the pads and the various layers within the printed circuit board, whereby a capacitance presenting arrangement 23, in the form of a previously known discrete component, is connected to a supply voltage related layer and a reference potential related layer through the connecting pads 2a and 2b and the connecting conductors 21 and 22.

Figure 3:
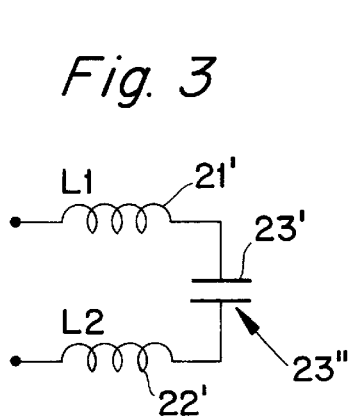
FIG. 3 shows the principal wiring-diagram of a smoothing condenser function and a spike condenser function.

With reference to FIG. 3 it is shown that every such capacitance presenting circuit will comprise an inductance (L1) with an inductance value 21', corresponding mainly to the length of the conductor 21, an inductance (L2) with the inductance value 22', corresponding mainly to the length of the conductor 22, an inner inductance (not shown) belonging to the condenser with an inductance value 23' and the capacitance of the condenser with the value 23".

These various inductance and capacitance values forms an oscillating circuit with a resonance frequency which corresponds to the various values in question according to the previously given formulae.

The value of this resonance frequency can be increased by selecting significantly shorter connecting conductors 21, 22, with thereby lower inductance values, according to the principles of the present invention.

The resistive values of the circuit according to FIG. 3 have been ignored in order to simplify the understanding of the invention.

Figure 4:
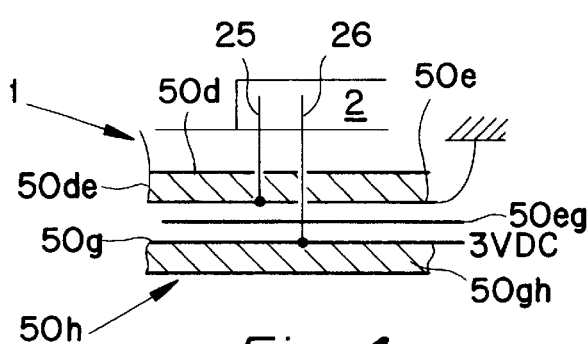
FIG. 4 shows an illustration of an enlarged section through a printed circuit board, to hereby closer illustrate the significant characteristics of the invention.

FIG. 4 is intended to illustrate that an electrically conductive copper layer 50d is applied to the top surface of an electrically isolating layer 50de and that an electrically conductive copper layer 50e is applied to the bottom surface of said layer 50de and that these layers constitutes a "sheet".

An electrically conductive copper layer 50g is in the same way applied to the top surface of an electrically isolating layer 50gh and an electrically conductive copper layer 50h is applied to the bottom surface of said layer 50gh and these layers constitutes also a sheet.

These sheets can be brought towards one another with a thin electrically isolating layer 50eg between the layers 50e and 50g, where this layer 50eg is selected to be a lot thinner then the layers 50de and/or 50gh, in order to thereby achieve a more effectively functioning spike condenser function.

The two layers 50e and 50g forms the electrically conductive layers within a plate condenser and the distance between the layers, corresponding to the thickness of the layer 50eg, is to be selected to be small in order to achieve a desired high capacitive value.

In FIG. 4 the sheet 50d, 50de, 50e is shown on an excessive distance from the sheet 50g, 50gh, 50h in order to illuminate the invention.

Figure 5:
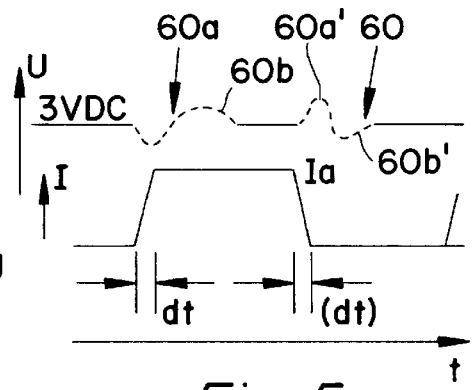
FIG. 5 is intended to illustrate the rise and fall times of an activated current pulse within a circuit and the voltage variations of the supply voltage that are caused by this current pulse.

FIG. 5 is intended to show how the magnitude of the appearing voltage spikes depends on the rise "dt" and fall (dt) times of the current (I) as a circuit is activated and deactivated.

At an activation, with a short rise time "dt" and a large current load (Ia), it can be supposed that a voltage spike 60a (dotted line) descends below a given DC-level 60 followed by an increase of the DC-level 60, according to the dotted line 60b.

These voltage variations can be expected close to the areas where the connecting conductors 25, 26 are connected to the layers 50e, 50g and these variations are smoothed around the specific area surrounding the connecting points and the circuit by the energy which is stored within this area, meaning an adapted (circular) surface partition of the plate condenser around the circuit 2 and the connections 25, 26. Corresponding voltage variations occur at a deactivation of the circuit with an increase 60a' followed by a decrease 60b' of the voltage level 60.

Figure 6:
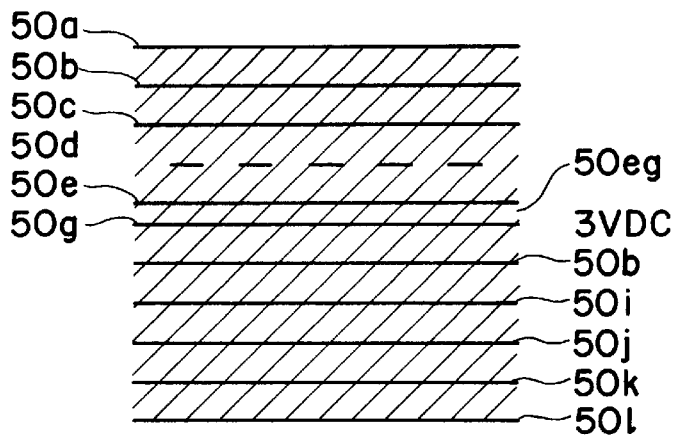
FIG. 6 shows a enlarged section through a complete printed circuit board in order to thereby illustrate the orientation of the electrically conductive layers and the electrically isolating layers.

In enlarged scale, with reference to FIG. 6, it is illustrated that a printed circuit board 1 can be made out of several electrically conductive layers with interjacent electrically isolating layers and it is here illustrated that at least one of said electrically conductive layers 50e is related to reference potential, such as ground potential, and that at least one adjacent electrically conductive layer 50g is related to supply voltage, in this case 3 VDC.

In the practical case every IC-circuit, such as the one numbered 2, and/or component 3, is supplied with a voltage through connecting conductors, such as 25, 26, which are connected to said reference potential related layer 50e and/or said supply voltage related layer 50g or other layers. An extremely thin isolating layer 50eg is positioned between said electrically conductive layers 50e and 50g.

It is more specifically illustrated, with reference to FIG. 6, that a section through a printed circuit board can comprise one electrically conductive pad layer 50a, one reference potential related layer 50b connected to ground potential, one signal layer 50c and one signal layer 50d, one supply voltage related layer 50e with a 3 VDC voltage, one thin electrically isolating layer 50eg, one reference potential related layer 50g, one further reference potential related layer 50h, one signal layer 50i and one signal layer 50j, one reference potential related layer 50k and one pad layer 50l.

Between every such electrically conductive layer there is an electrically isolating layer, of which only a few have been given numerals, such as 50eg.

Every layer without a numeral is selected to have one and the same thickness, such as 0.25 mm.

Figure 2:
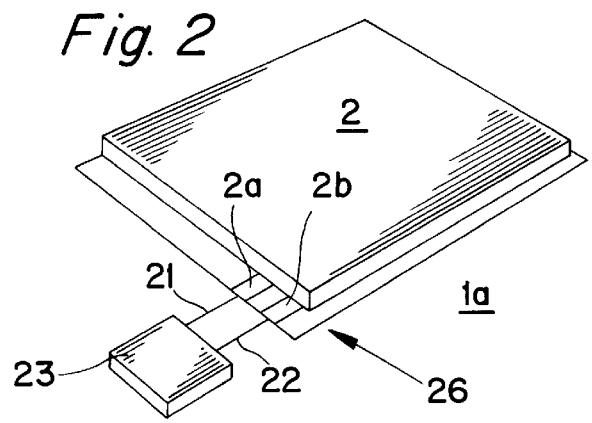
FIG. 2 show, in perspective view, an integrated circuit on one surface of a printed circuit board, which, in a known way, is equipped with a spike condenser, being a discrete component.

With renewed reference to FIGS. 2 and 3 it is obvious that the inductance values 21' and 22' are dependant of the respective lengths of the conductors 21 and 22 but it should mainly be taken into consideration that the conductors 21 and 22 are bare and that these will, at high switching frequencies and corresponding voltage variations, function as antennas and be sensitive to effects concerning EMC.

The present invention is thus intended to provide both a capacitance connection, which is built into a printed circuit board and which thereby does not require extra connecting conductors 21, 22 since the connection of the capacitance is performed through the voltage supplying conductors 25, 26, and a capacitance values presenting coupling device, where said coupling device belongs to a printed circuit board, which is built on the use of the capacitance value of a plate condenser, according to the formulae $$C = E \times A/d,$$

where "A" is the surface extension between the electrically conductive layers of the plate condenser, "d" is the distance between said layers and "E" is the dielectric constant, depending on the selected electrically isolating material between the layers.

The present invention is built on the principle that the surface extension of said reference potential related layer, and the opposite surface extension of said supply DC-voltage related layer and a chosen distance in between said layers are each adapted and selected to form a spike capacitor function in order to create the required conditions to keep the supplied DC-voltage and/or ground potential, even at rapid variations of the activation and/or rapid power comsumption of said circuits and/or components.

It is hereby shown by the present invention, since the capacitive value of the condenser ought to be selected to be as high as possible, that the peripheral edge partitions of a selected surface extension, belonging to said layers, are limited by, and possibly somewhat within, the peripheral edge partitions of the printed circuit board.

It is further shown that the distance, between the electrically conductive layers, is adapted to 0.15 mm or less.

An epoxy coated glass-fibre armed film, with the thickness of approximately 0.06 mm, can preferably be used as the isolating layer 50eg.

The value 0.06 mm is adapted to the present process of manufacturing printed circuit boards, where at least that thickness, and possibly somewhat thinner, is required to comply with the requirements of cleanliness in the present methods of manufacture.

The present invention is built on a desire to be able to decrease said distance even further, since the capacitance value of a plate condenser increases with shorter distances, which can be achieved at cleaner manufacturing environments.

Rapid variations at the activation appears whenever the rise time "dt" or the fall time (dt) of the activated current pulses are selected to be in the region of or shorter then nano seconds, and this is specifically accurate whenever several transistor functions, within integrated circuits, are to be activated simultaneously.

The value of the capacitance is thus adaptable through the selection of the thickness of the electrically isolating layer and the selected dielectric constant of the material within said layer.

The thickness of the layer 50*eg* is, for the present invention, at least to exceed a selected smallest limit value, a safety value.

Figure 7:
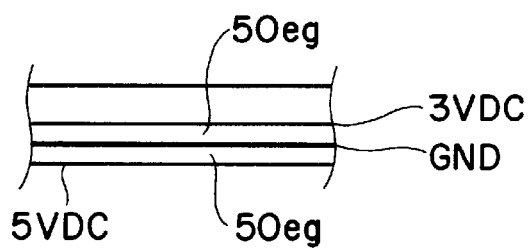
FIG. 7 shows a section through a part of a printed circuit board with a first alternative of a spike condenser connection.

FIG. 7 illustrates an alternative embodiment where a ground potential related layer (GND) is positioned interjacent two layers related to two supply voltages, 3 VDC and 5 VDC.

Figure 8:
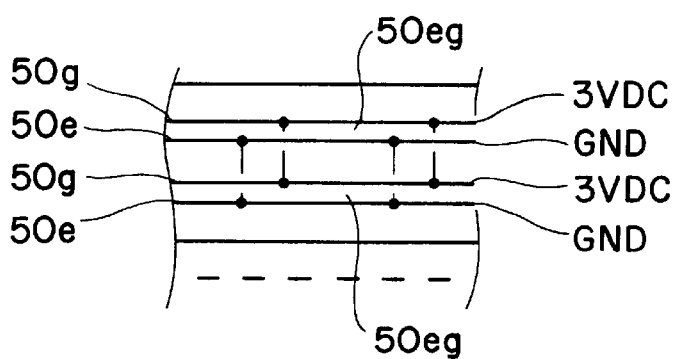
FIG. 8 shows a section through a part of a printed circuit board with a second alternative of a spike condenser connection.

FIG. 8 illustrates an alternative embodiment where two parallel connected spike condensers are built into one and the same printed circuit board.

It will be understood that the invention is not restricted to the illustrated exemplifying embodiments thereof and that modifications can be made within the scope of the inventive thought illustrated in the following claims.

We claim:

1. A printed circuit board comprising:

a plurality of electrically conducting layers where at least one of said electrically conducting layers is a reference potential layer and at least one other of said electrically conducting layers is a supply voltage layer;

an electrically isolating layer positioned between adjacent reference potential and supply voltage layers;

a plurality of circuits and/or components mounted on said printed circuit board, wherein at least one of said plurality of circuits and/or components is supplied with a voltage through a plurality of connecting conductors which are connected to said reference potential and supply voltage layers; and a DC/DC-converting circuit mounted on said printed circuit board and comprising a plurality of adapted smoothing capacitors;

wherein said electrically isolating layer is composed of a plastic-coated, glass-fiber fabric with a thickness in a range of 0.01 to 0.06 mm;

said plurality of connecting conductors are less than 1.5 mm in length;

a rise time and/or fall time of an instantaneous current created as a result of said plurality of circuits and/or components being activated/deactivated is within a range of nano-seconds to pico-seconds; and a surface extension of adjacent reference potential and supply voltage layers and the thickness of said associated electrically isolating layer are adapted to form a capacitor function to smooth voltage spikes so that the supply voltage can be constant around said plurality of circuits and/or components even at rapid variations in the activation and deactivation of said plurality of circuits and/or components.

2. The printed circuit board of claim 1 wherein a number of reference potential layers and a number of supply voltage layers are electrically connected to one another in order to form a number of parallel voltage spikes smoothing condensers.

3. The printed circuit board of claim 1 wherein said plurality of electrically conducting layers includes a reference potential layer sandwiched between a first voltage supply layer and a second voltage supply layer.

4. The printed circuit board of claim 3 wherein the first and second voltage supply layers have different supply voltages.

* * * * *